US010127948B1

(12) United States Patent
Jau et al.

(10) Patent No.: US 10,127,948 B1
(45) Date of Patent: *Nov. 13, 2018

(54) EXTENDABLE HARD DRIVE DRAWER

(71) Applicant: QUANTA COMPUTER INC., Taoyuan (TW)

(72) Inventors: Maw-Zan Jau, Taoyuan (TW);
Chao-Jung Chen, Taoyuan (TW);
Yaw-Tzorng Tsorng, Taoyuan (TW);
I-Lang Cheng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/639,064

(22) Filed: Jun. 30, 2017

Related U.S. Application Data

(63) Continuation of application No. 14/593,119, filed on Jan. 9, 2015, now Pat. No. 9,763,352.

(30) Foreign Application Priority Data

Jan. 16, 2014 (TW) .............................. 103101638 A

(51) Int. Cl.
*H05K 5/00* (2006.01)
*G11B 33/12* (2006.01)
(Continued)

(52) U.S. Cl.
CPC ......... *G11B 33/128* (2013.01); *H05K 5/0217* (2013.01); *H05K 5/03* (2013.01); *H05K 7/14* (2013.01); *H05K 5/02* (2013.01)

(58) Field of Classification Search
CPC .. G11B 33/128; H05K 5/0217; H05K 7/1402; H05K 7/1411; H05K 7/1421; G06F 1/187
See application file for complete search history.

(56) References Cited

U.S. PATENT DOCUMENTS 5,187,643 A 2/1993 I-Shou
5,460,441 A 10/1995 Hastings et al.
(Continued)

FOREIGN PATENT DOCUMENTS

EP 1251504 A2 10/2002
JP 2003-36669 A 2/2003
(Continued)

OTHER PUBLICATIONS

Office Action dated Nov. 6, 2014; in a corresponding Taiwanese patent application.
(Continued)

*Primary Examiner* — Daniel J Rohrhoff
(74) *Attorney, Agent, or Firm* — Nixon Peabody LLP; Eduardo J. Quiñones

(57) ABSTRACT

An apparatus comprising at least one extendable hard drive drawer for replacement and maintenance of at least one hard drive. The apparatus comprises a chassis comprising a front side and a rear side, and a first hard drive carrier and a second hard drive carrier housed within the chassis. The first hard drive carrier can be housed at the front side of the chassis, and the second hard drive carrier can be located behind the first hard drive carrier. The first hard drive carrier and the second hard drive carrier can each be adapted to house at least one hard drive. The first hard drive carrier can be adapted to slide from a closed position to a first open position, and from the first open position to a second open position, such that the second hard drive carrier can be accessed in the second open position.

16 Claims, 7 Drawing Sheets

(51) Int. Cl.
*H05K 5/02* (2006.01)
*H05K 5/03* (2006.01)
*H05K 7/14* (2006.01)

(56) References Cited

U.S. PATENT DOCUMENTS

| | | | |
|---|---|---|---|
| 5,940,355 | A | 8/1999 | Buckland et al. |
| 5,949,645 | A | 9/1999 | Aziz et al. |
| 6,025,989 | A | 2/2000 | Ayd et al. |
| 6,611,424 | B2 | 8/2003 | Huang |
| 6,648,428 | B2 | 11/2003 | Chaloner et al. |
| 6,685,033 | B1 | 2/2004 | Baddour et al. |
| 6,813,113 | B1 | 11/2004 | Mueller et al. |
| 7,054,151 | B2 | 5/2006 | Wang et al. |
| 7,104,618 | B2 | 9/2006 | Chaloner et al. |
| 8,009,385 | B2 | 8/2011 | Starr et al. |
| 8,107,256 | B1 | 1/2012 | Kondrat et al. |
| 8,351,148 | B2 | 1/2013 | Ishii |
| 8,462,502 | B2 | 6/2013 | Hirano et al. |
| 8,857,927 | B2 | 10/2014 | Johnson et al. |
| 8,897,017 | B2 | 11/2014 | Brashers et al. |
| 8,953,326 | B2 | 2/2015 | Peng et al. |
| 9,070,419 | B1 | 6/2015 | Zhu et al. |
| 9,335,798 | B1* | 5/2016 | Lin ............... H05K 7/1489 |
| 9,763,352 | B2* | 9/2017 | Jau ............... H05K 7/1488 |
| 2002/0181197 | A1 | 12/2002 | Huang |
| 2003/0019822 | A1 | 1/2003 | Liu |
| 2011/0249392 | A1 | 10/2011 | Kadri et al. |
| 2011/0284422 | A1 | 11/2011 | Yamada |
| 2013/0265725 | A1 | 10/2013 | Harvilchuck |
| 2013/0342990 | A1* | 12/2013 | Jau ....................... G06F 1/18 361/679.39 |
| 2014/0055959 | A1 | 2/2014 | Manda |
| 2014/0117822 | A1 | 5/2014 | Fan et al. |
| 2014/0204525 | A1 | 7/2014 | Pecone et al. |
| 2014/0293523 | A1* | 10/2014 | Jau ....................... H05K 7/1492 361/679.4 |
| 2014/0340837 | A1 | 11/2014 | Jau et al. |
| 2015/0016050 | A1* | 1/2015 | Chen ............... G11B 33/128 361/679.33 |
| 2015/0208543 | A1* | 7/2015 | Chen ............... H05K 7/1489 361/679.39 |
| 2015/0271943 | A1* | 9/2015 | Peng ............... G11B 33/128 361/679.39 |
| 2016/0132080 | A1* | 5/2016 | Shen ............... G06F 1/187 361/679.33 |
| 2017/0205857 | A1* | 7/2017 | Moore ............... G06F 1/187 |

FOREIGN PATENT DOCUMENTS

| | | |
|---|---|---|
| JP | 200336669 A | 2/2003 |
| TW | M 441186 U | 11/2012 |

OTHER PUBLICATIONS

English language abstract for TW M 441186; published Nov. 11, 2012.
English language abstract for JP 2003-36669 A; published Feb. 7, 2003.
Extended European Search Report dated Jul. 7, 2015 in European Application No. 14200695.6.
English Translation of Abstract of Japanese Application No. 200123449 filed on Jul. 13, 2001.
Summary of European Search Report dated Jul. 7, 2015 in European Application No. 14200695.6.
English Translation of Abstract of Citations in Extended European Search Report dated Jul. 7, 2015 in European Application No. 14200695.6.

\* cited by examiner

EXTENDABLE HARD DRIVE DRAWER

CROSS-REFERENCE TO RELATED APPLICATIONS

This application is a continuation of U.S. Non-Provisional patent application Ser. No. 14/593,119, entitled "EXTENDABLE HARD DRIVE DRAWER" and filed Jan. 9, 2015, which claims priority to, and the benefit of, Taiwanese Patent Application No. 103 101 638, filed Jan. 16, 2014, the contents of both of which are herein incorporated by reference in their entirety.

TECHNICAL FIELD

The disclosure generally relates to accessing hard drives in a server chassis.

BACKGROUND

Hard drives are typically housed in a server chassis and are used for storing information in a server. Conventionally, the hard drives can be housed at the front of the server chassis for access to the hard drives for the purpose of replacement or maintenance. At times, it may be desirable to maximize the storage capacity of the server by housing many hard drives inside the chassis. However, due to space limitations of the server chassis, only a limited amount of hard drives can be housed in the server at once, and, of those hard drives, only a limited number of hard drives can be easily accessible from the front for the purpose of replacement or maintenance.

SUMMARY

In some implementations, an apparatus can be configured with at least one extendable hard drive drawer for replacement and maintenance of at least one hard drive. The apparatus comprises a chassis comprising a front side and a rear side, and a first hard drive carrier and a second hard drive carrier housed within the chassis. For example, the first hard drive carrier can be housed at the front side of the chassis, and the second hard drive carrier can be located behind the first hard drive carrier. The first hard drive carrier and the second hard drive carrier can each be adapted to house at least one hard drive. In some implementations, the first hard drive carrier is slidably coupled to the chassis. For example, the first hard drive carrier can be adapted to slide from a closed position to a first open position, and from the first open position to a second open position, such that the second hard drive carrier can be accessed in the second open position.

Particular implementations provide at least the following advantages: front side access to multiple rows of hard drives for the purpose of replacement and maintenance, and maximum storage and organization of hard drives within a server chassis.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Figure 1:
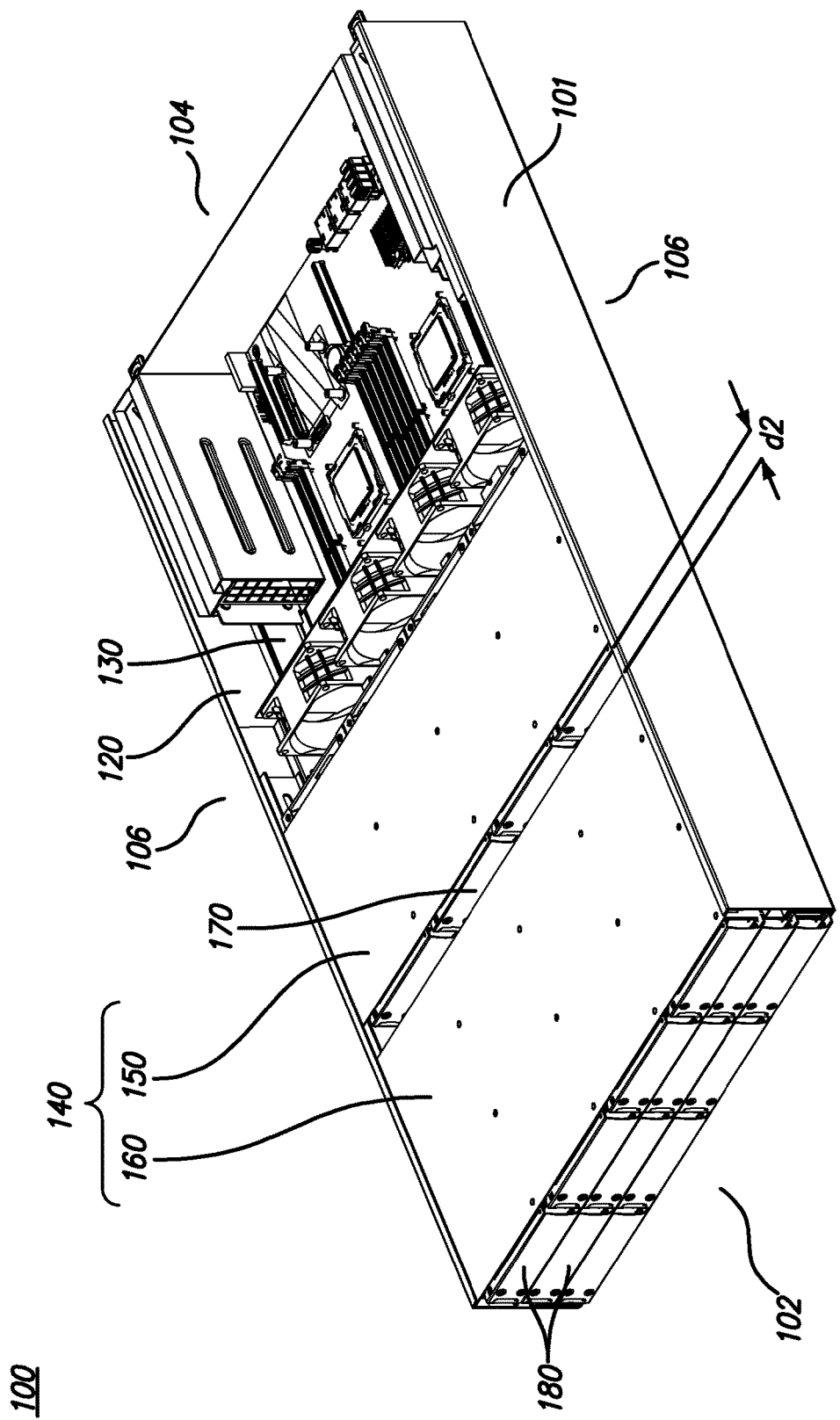
FIG. 1 is an isometric view of an extendable hard drive drawer apparatus showing a chassis housing a first hard drive drawer and a second hard drive drawer in a first closed position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and members have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening members, and is not necessarily limited to physical connections. The connection can be such that the objects are permanently connected or releasably connected. The term "substantially" is defined to be essentially conforming to the particular dimension, shape or other word that substantially modifies, such that the member need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

In practice, a first hard drive drawer and a second hard drive drawer are housed within a server chassis at a first closed position. The first hard drive drawer can be located at the front of the server chassis, and the second hard drive drawer can be located behind the first hard drive drawer. Both the first hard drive drawer and the second hard drive drawer can be adapted to house at least one hard drive, and can be slidably coupled to the server chassis. In the first closed position, only the first hard drive drawer is accessible from the front of the server chassis. The first hard drive drawer can be pulled out from the server chassis to a first open position, such that the first hard drive drawer extends beyond the front of the server. As the first hard drive drawer is pulled out from the first open position to a second open position, the second hard drive drawer becomes accessible from the front of the server for the purpose of hard drive replacement or maintenance.

In some implementations, the first and second hard drive drawers can be pulled out from the second open position to a third open position. In the third position, at least one fan located behind the second hard drive drawer can be accessed from the front of the server for the purpose of replacement or maintenance.

To close the drawers to return to the first closed position from the third or second open positions, the first hard drive drawer is pushed back towards the second hard drive drawer into a second closed position, such that at least the first hard drive drawer abuts the second hard drive drawer and extends beyond the front of the server. Then, both the first and second hard drive drawers are pushed back into the server chassis from the second closed position to the first closed position.

FIG. 1 illustrates an example extendable hard drive drawer apparatus 100 in a first closed position for accessing tray unit 140 comprising first hard drive drawer 160 and second hard drive drawer 150. In some implementations, first hard drive drawer 160 can be spaced apart from second hard drive drawer 150 by at most a distance d2. The closer first hard drive drawer 160 and second hard drive drawer 150 are to each other, the less space they take up in apparatus 100. For example, distance d2 can be any numerical amount less than a width of each hard drive drawer 150 and 160 (e.g., 0.5 inch, 1 cm, etc.). In some implementations, first hard drive drawer 160 and second hard drive drawer 150 are not spaced apart.

In some implementations, first hard drive drawer 160 can be adapted to house at least one hard drive, and second hard drive drawer 150 can be adapted to house at least one hard drive. For example, first hard drive drawer 160 can be adapted to house first hard drive group 180, and second hard drive drawer 150 can be adapted to house second hard drive group 170. First hard drive group 180 and second hard drive group 170 can comprise a plurality of hard drives (e.g., HDD, SSD, SCSI, SATA, PATA, internal, external, etc.). The plurality of hard drives can be grouped above one another and side-by-side according to means known in the art, including, but not limited to, slots, shelves, dividers, rows, columns, etc. For example, the plurality of hard drives can be arranged in multiple rows and columns within first and second hard drive groups 180 and 170. The plurality of hard drives can be adapted to be removable and hot-swappable according to means known in the art, including, but not limited to, clips, snap fit, friction fit, hard drive caddy, etc.

In some implementations, apparatus 100 can comprise chassis 101 (e.g., server chassis) for housing first hard drive drawer 160 and second hard drive drawer 150. For example, chassis 101 can be any server chassis known in the art (e.g., 1U, 2U, etc.). Chassis 101 can be made of any combination of materials, such as, metal, plastic, alloys, etc. Chassis 101 can comprise front side 102 and rear side 104. For example, first hard drive drawer 160 can be housed in front side 102. In some implementations, chassis 101 can house control board 130 (e.g., motherboard). For example, control board 130 can be housed at rear side 104. Control board 130 can be coupled to tray unit 140 according to cabling means known in the art, including, but not limited to, cable arm, cabling along sides of the chassis, storing cables underneath the drawers, etc.

In some implementations, chassis 101 can comprise top rail 120 and bottom rail 130. For example, top rail 120 can comprise a top grooved section of opposed sides 106 of chassis 101. Bottom rail 130 can comprise a bottom grooved second of opposed sides 106 of chassis 101. The top and bottom grooved sections can be machined into opposed sides 106 of chassis 101 according to means known in the art for drawers, including, but not limited to, molding, cutting, folding, etc. For example, top rail 120 and bottom rail 130 can be machined or otherwise coupled (e.g., using nails or screws) to opposed sides 106 (e.g., according to means commonly known in the art for drawers) such that each rail takes up half the width of each opposed side 106. Top rail 120 and bottom rail 130 can be uniform in width, and can run the entire length of opposed sides 106. Top rail 120 and bottom rail 130 can be made of the same material as chassis 101 (e.g., metal, plastic, alloys, etc.).

Figure 2:
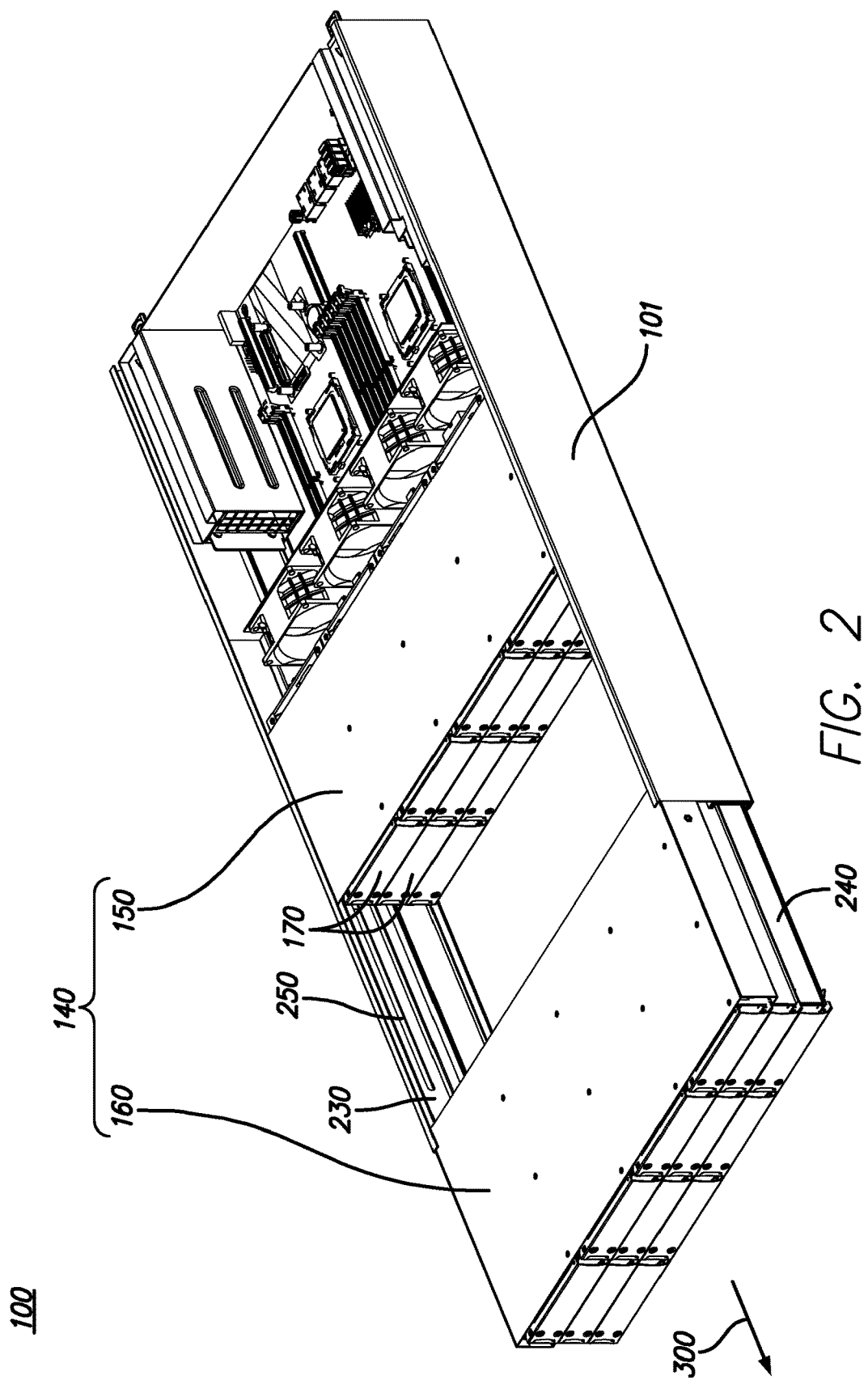
FIG. 2 is an isometric view of the apparatus of FIG. 1 showing the apparatus in a first open position.

FIG. 2 illustrates apparatus 100 in a first open position. First hard drive drawer 160 is pulled in an outward direction through an outward force 300 from chassis 101. As first hard drive drawer 160 is pulled away from second hard drive drawer 150 from the first closed position to the first open position, second hard drive drawer 150 remains in place within chassis 101. In some implementations, first hard drive drawer 160 is coupled to first extendable portion 240 for the purposes of sliding outwardly from chassis 101. For example, first extendable portion 240 can be adapted to slide within bottom rail 130 on opposed sides 106. Alternatively, first extendable portion 240 and bottom rail 130 can be adapted to be nested within each other such that the rails telescope with respect to one another (e.g., as commonly known in the art for drawers). In some implementations, first hard drive drawer 160 can be locked into place a maximum distance apart from second hard drive drawer 150.

In some implementations, first extendable portion 240 can comprise bars attached to the sides of first hard drive drawer 160. For example, the bars can be adapted to slidably fit into bottom rail 130. In some implementations, first extendable portion 240 can be adapted to slide out along with first hard drive drawer 160. First extendable portion 240 can be made of standard materials in the art for railing, including, but not limited to, plastic, metal, alloys, etc. In some implementations, first extendable portion 240 can comprise sliding means known in the art for facilitating movement within bottom rail 130, including, but not limited to, bearings, wheels, sliders, frictionless surfaces, etc.

Figure 3:
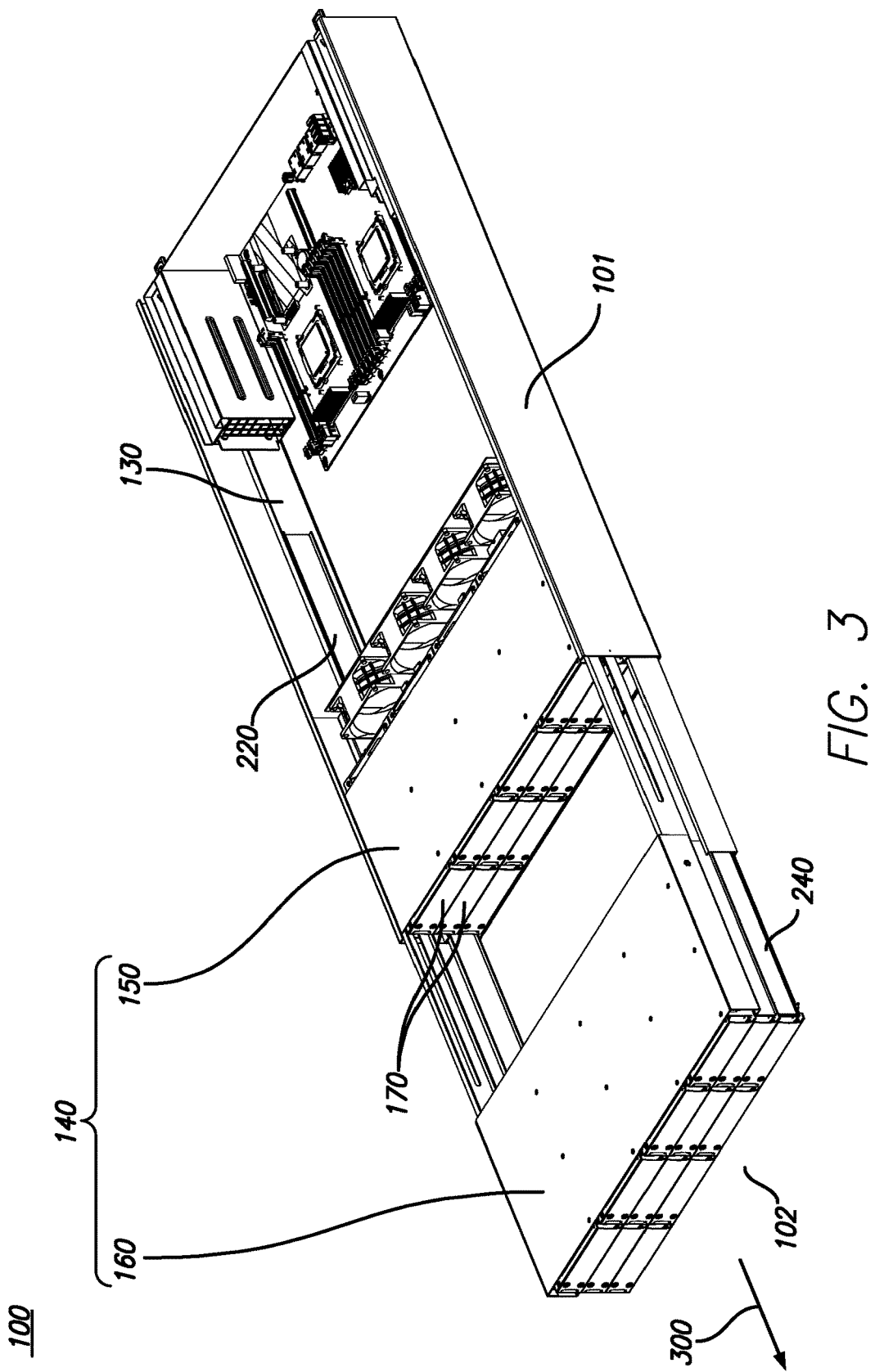
FIG. 3 is an isometric view of the apparatus of FIG. 1 showing the apparatus in a second open position.

FIG. 3 illustrates apparatus 100 in a second open position. In some implementations, while sliding from the first open position to the second open position, first hard drive drawer 160 and second hard drive drawer 150 remain a fixed distance apart, and both slide out together. For example, first hard drive drawer 160 and second hard drive drawer 150 both are pulled in the outward direction through outward force 300 together from the first open position to the second open position. In some implementations, outward force 300 is applied only to first hard drive drawer 160, such that second hard drive drawer 150 is a fixed distance (e.g., at least the length of a hard drive) apart from first hard drive drawer 160 as both hard drive drawers 150 and 160 slide outwardly together. For example, second hard drive drawer 150 remains a fixed distance behind first hard drive drawer 160 as both hard drive drawers 150 and 160 are simultaneously pulled out. In some implementations, first hard drive drawer 160 can be locked into place at the fixed distance apart from second hard drive drawer 150 such that pushing and pulling on first hard drive drawer 160 also causes second hard drive drawer 150 to move at the fixed distance.

In some implementations, first extendable portion 240 can be adapted to be slidably housed within second extendable portion 220 such that first extendable portion 240 slides independently of second extendable portion 220. Second extendable portion 220 can be adapted to be housed within bottom rail 130. For example, second extendable portion 220 can be slidably fit into bottom rail 130. In some implementations, second extendable portion 220 can be adapted to slide out along with first hard drive drawer 160. Second extendable portion 220 can be made of standard materials in the art for railing, including, but not limited to, plastic, metal, alloys, etc. In some implementations, second extendable portion 220 can comprise sliding means known in the art for facilitating movement within bottom rail 130, including, but not limited to, bearings, wheels, sliders, frictionless surfaces, etc.

Once in the second open position, second hard drive group 170 can be accessed from front side 102 for the purposes of repair, replacement, and maintenance. Because first hard drive drawer 160 and second hard drive drawer 150 are spaced apart at least a distance equal to the length of a hard drive, replacement and maintenance of second hard drive group 170 can be accomplished from front side 102.

Figure 4:
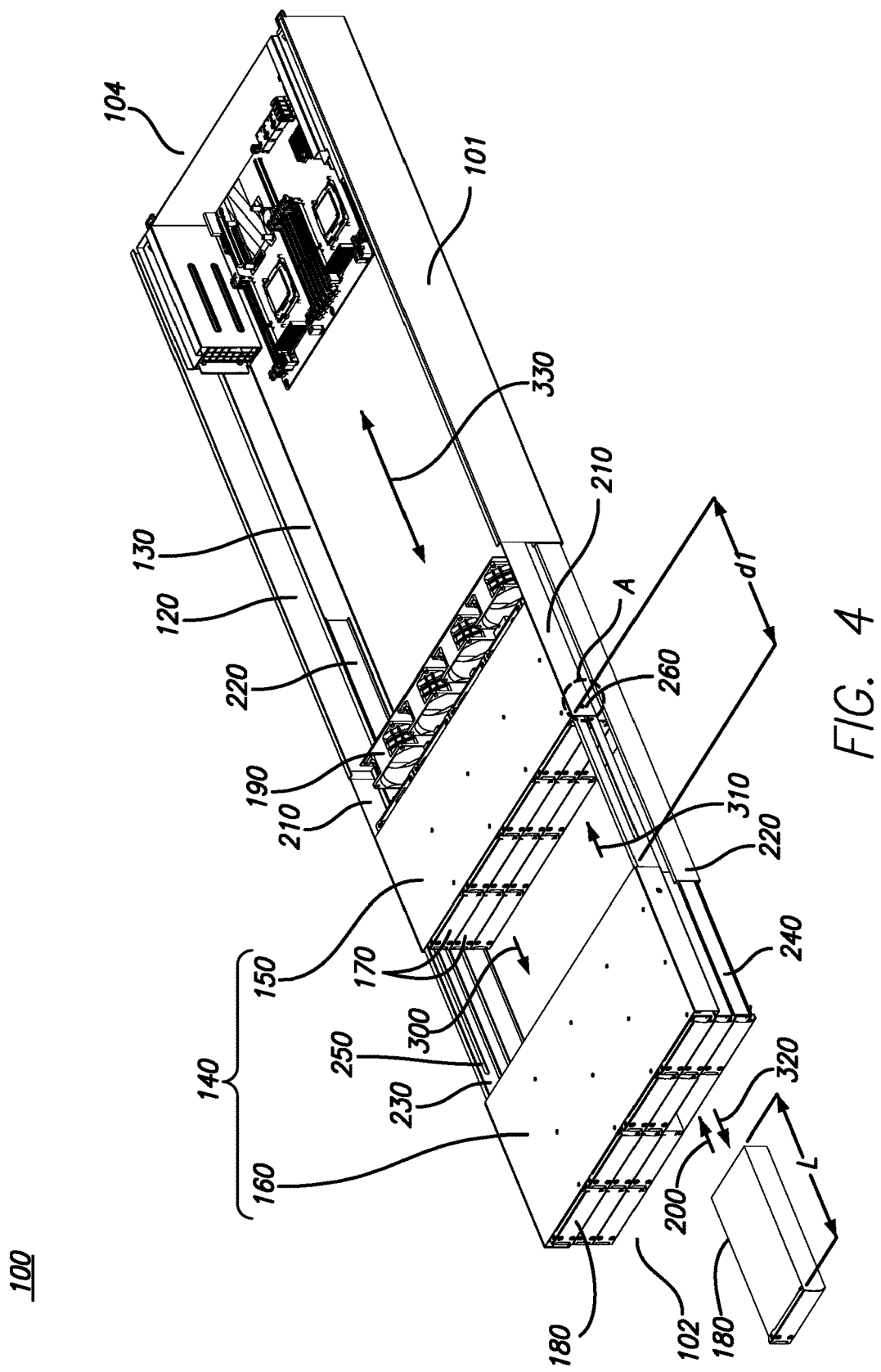
FIG. 4 is an isometric view of the apparatus of FIG. 1 showing the apparatus in a third open position.

FIG. 4 illustrates apparatus 100 in a third open position. First and second hard drive drawers 150 and 160 slide outwardly together from the second open position to the third open position while maintaining the fixed distance between them.

In some implementations, limiting bar 230 can be used to limit the fixed distance to a maximum distance d1 between first hard drive drawer 160 and second hard drive drawer 150 in the first, second, and third open positions. For example, limiting bar 230 can comprise sliding aperture 250 for defining the maximum distance d1 between first hard drive drawer 160 and second hard drive drawer 150. The maximum distance d1 is at least a length L of a hard drive that fits into hard drive drawers 150 and 160. For example, the distance d1 is big enough to allow a hard drive to be removed from second hard drive drawer 150.

In some implementations, second hard drive drawer 150 can comprise a fixed point 260 for fixing the maximum distance d1 between first hard drive drawer 160 and second hard drive drawer 150. For example, fixed point 260 can be slidably coupled to the sides of second hard drive drawer 150 and sliding aperture 250 of limiting bar 230. As can be seen from FIGS. 1-6, fixed point 260 slides along sliding aperture 250, to define how close d2 (FIG. 1) and how far apart d1 first hard drive drawer 160 and second hard drive drawer 150 are. For example, sliding aperture 250 runs a defined distance along the length of limiting bar 230. The defined distance determines how close d2 (FIG. 1) and how far apart d1 first hard drive drawer 160 can be from second hard drive drawer 150.

In some implementations, second hard drive drawer 150 can be coupled to top extending portion 210. For example, top extending portion 210 can be adapted to slidably fit into top rail 120. Top extending portion 210 can be adapted to slide out along with second hard drive drawer 150. In some implementations, top extending portion 210 can limit how far out first and second hard drive drawers 150 and 160 can extend by locking into place at front 102 of chassis 101. For example, top extending portion 210 can be equal to the length of second hard drive drawer 150. Alternatively, top extending portion 210 can be equal to a length longer than second hard drive drawer 150 to account for computer components (e.g., cooling fans) coupled to the back of second hard drive drawer 150.

In some implementations, second hard drive drawer 150 can comprise fans 190 (e.g., cooling fans). For example, fans 190 can be coupled to the back of second hard drive drawer 150 such that fans 190 slide along with second hard drive drawer 150. Fans 190 can be adapted to pull in cool air from front side 102 and blow the cool air towards rear side 104. Fans 190 can also blow hot air out from rear side 104.

In some implementations, in the third open position, fans 190 can be accessed from front side 102 for the purposes of repair, replacement, and maintenance. For example, top extending portion 210 can be equal to a length of second hard drive drawer 150 in combination with fans 190 such that the maximum distance first and second hard drive drawers 150 and 160 can extend outside chassis 101 includes fans 190.

In some implementations, apparatus 100 can be locked into the third open position according to means commonly known in the art for drawers, including, but not limited to, friction lock, snap lock, coupling lock, etc. For example, once apparatus 100 is locked into the third open position, first hard drive drawer 160 can be pushed towards using inward force 310 or away using outward force 300 from second hard drive drawer 150 freely without causing second hard drive drawer 150 to slide. In some implementations, first hard drive drawer 160 can be locked into place a fixed distance apart from second hard drive drawer 150.

Figure 5:
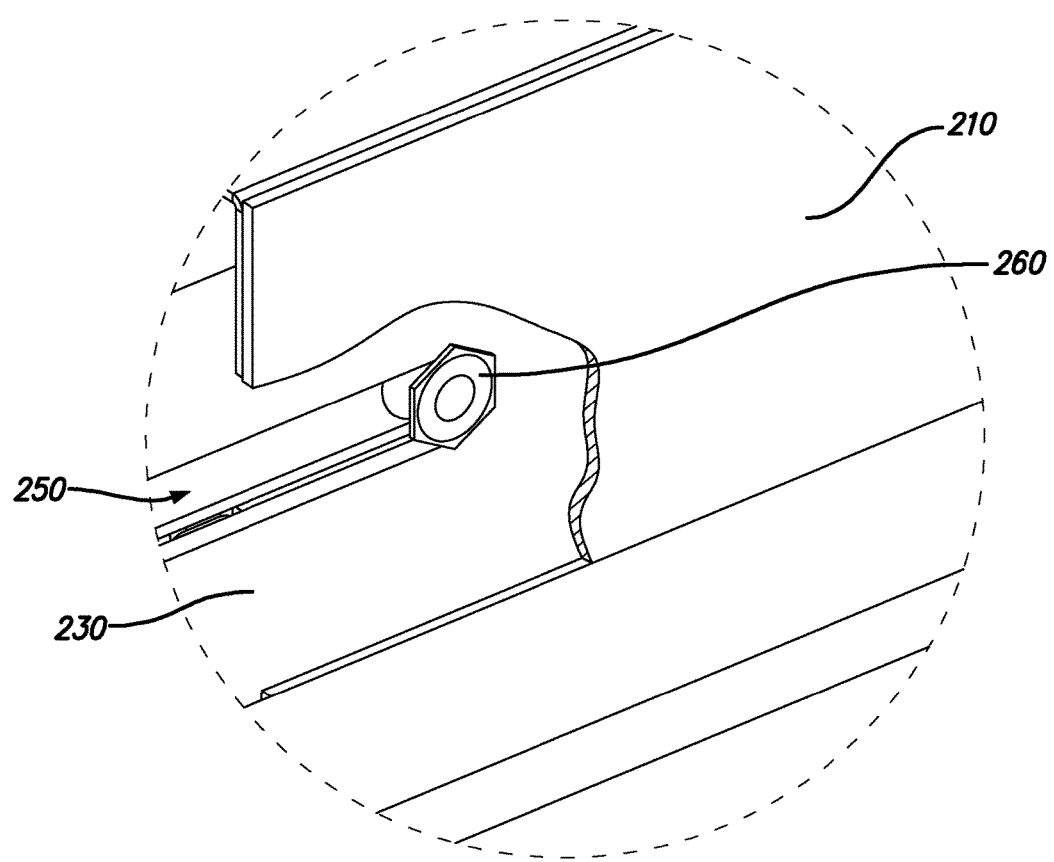
FIG. 5 is close-up exposed view of circled portion A of FIG. 4.

FIG. 5 illustrates a close-up exposed view of circled area A of FIG. 4 showing fixed point 260 slidably engaged with sliding aperture 250 of limiting bar 230. In some implementations, fixed point 260 can comprise a nut and screw combination as known in the art. Fixed point 260 can also comprise any fixed point means known in the art, including, but not limited to, screws, tabs, nails, etc.

In some implementations, limiting bar 230 can be slidably engaged with top extending portion 210. For example, top extending portion 210 can be slidably coupled to top rail 120 (FIGS. 1, 3 and 4) at opposing sides 106 (FIG. 1), while limiting bar 230 is slidably coupled to top extending portion 210. As first and second hard drive drawers 160 and 150 are pulled out from the first closed position to the first, second, and third open positions (FIGS. 1-4), limiting bar 230 can extend outward from top extending portion 210 while top extending portion 210 extends outward from top rail 120.

Figure 6:
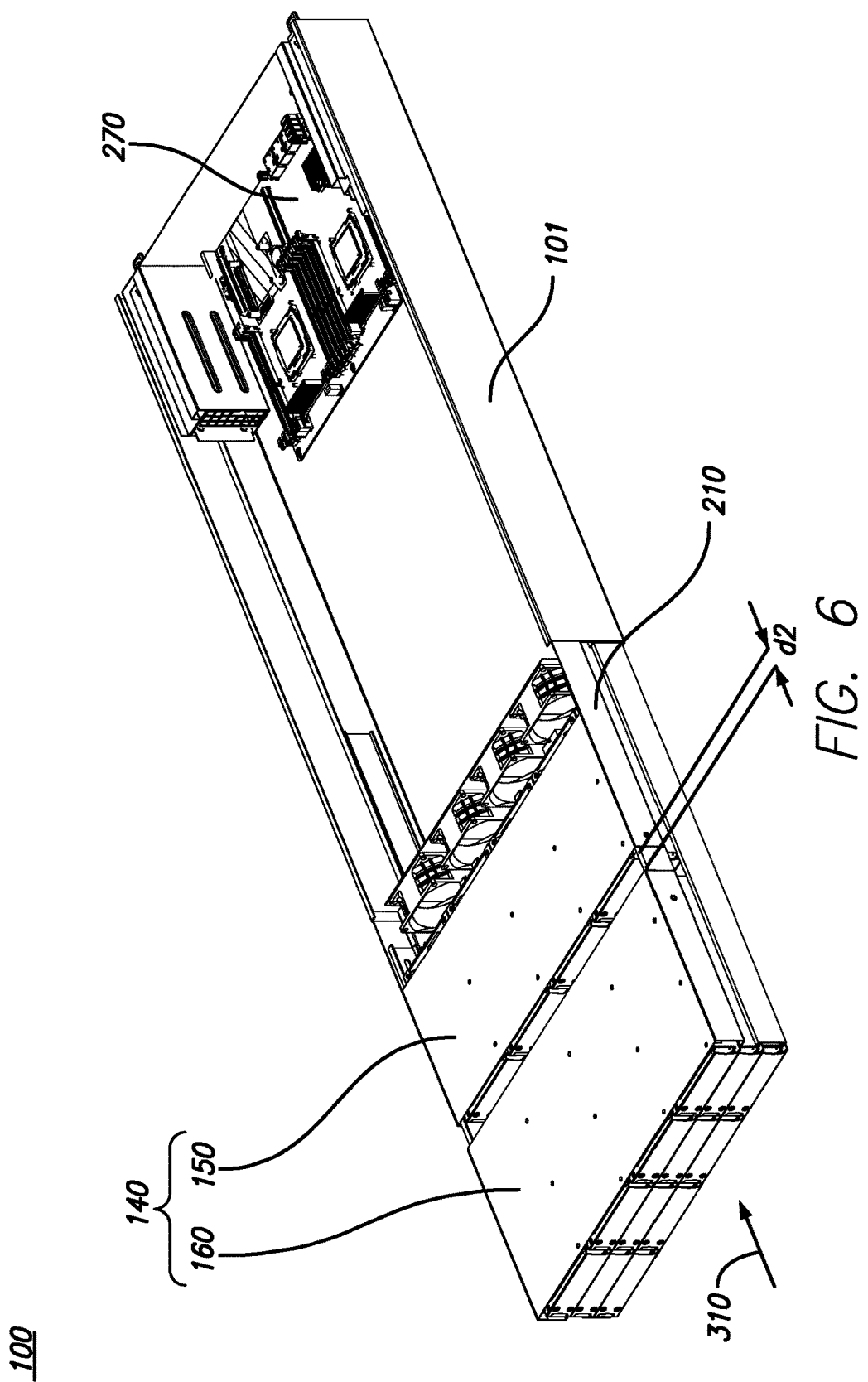
FIG. 6 is an isometric view of the apparatus of FIG. 1 showing the apparatus in a second closed position.

FIG. 6 illustrates apparatus 100 in a second closed position, where first hard drive drawer 160 is pushed back using inward force 310 towards chassis 101 to abut second hard drive drawer 150. In some implementations, second hard drive drawer 150 remains locked in place by top extending portion 210 as first hard drive drawer 160 is pushed back using inward force 310. Once first hard drive drawer 160 is abutting second hard drive drawer 150, both are pushed back together by exerting the inward force 310 on first hard drive drawer 160 until apparatus 100 is back to the first closed position.

In some implementations, first hard drive drawer 160 can be locked in place a fixed distance d1 (FIG. 4) from second hard drive drawer 150. As first hard drive drawer 160 is pushed back using inward force 310, second hard drive drawer 150 remains the fixed distance d1 (FIG. 4) apart from first hard drive drawer 160. Once second hard drive drawer 150 is pushed to its original position in front of control board 270, first hard drive drawer 160 can be pushed back to abut second hard drive drawer 150 at the minimum distance d2.

Although FIGS. 1-6 in the above description illustrate various versions, other implementations are possible. For example, first hard drive drawer 160 and second hard drive drawer 150 can be adapted to be supported by a base (not shown). The base can be a substantially planar sheet that is flat and comprised of materials similar to the chassis, such as metal, plastic, wood, alloys, etc. The base can provide support to first hard drive drawer 160 and second hard drive drawer 150 as first hard drive drawer 160 and second hard drive drawer 150 slide into and out of the various open and closed positions described above. In some implementations, the base can be dimensioned such that it is substantially the same width as one of first hard drive drawer 160 or second hard drive drawer 150, and can be substantially the same length as the combined length of first hard drive drawer 160 and second hard drive drawer 150 are in the first or second closed positions (e.g., at least twice the length of L). In some implementations, the base can be fixed to the bottom of second hard drive drawer 150, such that the base can slide along with second hard drive drawer 150. For example, the base can be fixed to second hard drive drawer 150 using means known in the art, including, but not limited to, welding, nails, screws, glue, etc. As second hard drive drawer 150 slides into the various open and closed positions, so does the base. In some implementations, first hard drive drawer 160 can be adapted to slide independently of the base. For example, as first hard drive drawer 160 slides into the first open position from the first closed position, the base and second hard drive drawer 150 stay in place. In some implementations, the base can comprise a hole (not shown) for providing access to second hard drive drawer 150 in the second or third open positions. For example, the hole can be any size and shape to allow for a user's hands to reach through the hole, from above or below the hole, to access second hard drive drawer 150.

In another implementation, first hard drive drawer 160 can comprise a first base (not shown), and second hard drive drawer 150 can comprise a second base (not shown). The first base and the second base can each be dimensioned the same width and length of their respective hard drive drawer. The first base and the second base can be substantially planar sheets that are flat and comprised of materials similar to the chassis, such as metal, plastic, wood, alloys, etc. For example, the first base and the second base can be fixed to first hard drive drawer 160 and second hard drive drawer 150, respectively, using means known in the art, including, but not limited to, welding, nails, screws, glue, etc. In some implementations, the first base and the second base can be fixed to first hard drive drawer 160 and second hard drive drawer 150 respectively, such that the first base and the second base slide along with first drive drawer 160 and second hard drive drawer 150 to and from the various open and closed positions. For example, the first base and the second base can provide support for first drive drawer 160 and second hard drive drawer 150 respectively, as first hard drive drawer 160 and second hard drive drawer 150 slide to and from the various open and closed positions.

In some implementations, first hard drive drawer 160 and second hard drive drawer 150 can be separated by a gap (FIGS. 1-4 and 6). The gap can be useful for accessing the hard drives. For example, the gap can be spaced such that the gap varies between lengths d1 and d2 as first hard drive drawer 160 and second hard drive drawer 150 slide to and from the various open and closed positions. In some implementations, the gap can be configured such that it is an empty space between first hard drive drawer 160 and second hard drive drawer 150. For example, the gap can be used to access first hard drive group 180 and second hard drive group 170 in the second and third open positions from either above the gap, or below the gap. In some implementations, the gap can be used to access second hard drive group 170 when second hard drive drawer 150 is in the second or third open positions. For example, a user can access the hard drives located in second hard drive group 170 from either above the gap, or below the gap. Because a server tower (not shown) can comprise a plurality of chasses 101 located a different heights, the gap allows for access to the hard drives regardless of how high or low the hard drives are located in the server tower.

Figure 7:
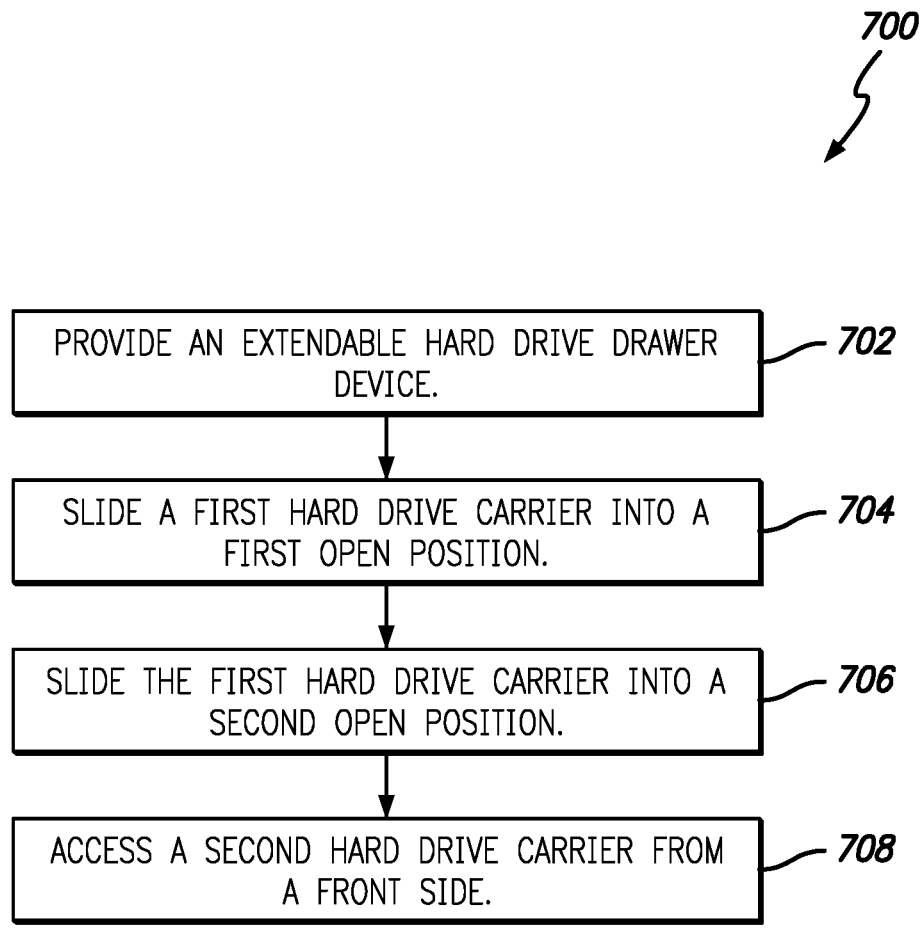
FIG. 7 is a flow diagram of an example method for accessing a second hard drive drawer located behind a first hard drive drawer in a server.

FIG. 7 is a flow diagram 700 of an example method for using an extendable hard drive drawer. The method described below can be carried out using the configurations illustrated in FIGS. 1-6, for example, and various elements of these figures are referenced in explaining the example method. Each block shown in FIG. 7 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method begins at block 702.

At block 702, an extendable hard drive drawer device is provided. The device can be a chassis comprising a front side and a rear side, the first hard drive carrier and the second hard drive carrier housed within the chassis, the first hard drive carrier housed at the front side, the second hard drive carrier housed behind the first hard drive carrier, the first hard drive carrier and the second hard drive carrier slidably coupled to the chassis, the first hard drive carrier and the second hard drive carrier each adapted to house at least one hard drive, and the first hard drive carrier adapted to slide from a first closed position to a first open position, and from the first open position to a second open position, such that the second hard drive carrier can be accessed in the second open position. The device can be structured according any of the described implementations above for cable storage under a drawer.

At block 704, the first hard drive carrier is slid to the first open position. The first hard drive carrier is slid a maximum distance apart from the second hard drive carrier. The maximum distance can be a fixed position. The first hard drive carrier can be extended outside of a chassis at the first open position.

At block 706, the first hard drive carrier is slid to the second open position. The first and second hard drive carriers are slid outwards from the chassis such that the second hard drive carrier is at the front of the chassis.

At block 708, the second hard drive carrier is accessed from the front side. At the second open position, the hard drives of the second hard drive carrier can be accessed from the front side for the purposes of repair, replacement, and maintenance.

A number of implementations have been described. Nevertheless, it will be understood that various modifications may be made. For example, other steps may be provided, or steps may be eliminated, from the described methods, and other components may be added to, or removed from, the described systems. Accordingly, other implementations are within the scope of the following claims.

For clarity and simplicity, only apparatus 100 is described. However, apparatuses comprising multiple chasses and hard drive drawers can be supported by the above disclosure. For example, multiple hard drive drawers (e.g., three or more hard drive drawers) can be stored in front of each other, as commonly known in server architecture, and each hard drive drawer adapted to slide in and out of the chassis according to the disclosure herein. Additionally, the drawers can house computing components other than hard drives. For example, the drawers can house any combination of hard drives, RAM, ROM, chipsets, PCI cards, etc.

Although a variety of examples and other information were used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. An apparatus, comprising:
a chassis comprising a chassis front side opposite a chassis rear side;
a first drawer slidably coupled to the chassis so as to slide in an outward direction with respect to the chassis front side to a first open position partly beyond the chassis front side and to a second open position beyond the chassis front side;
a second drawer positioned between the first drawer and the chassis rear side and slidably coupled to the chassis so as to slide in the outward direction, the second drawer comprising a drawer front end with at least one component receiving space facing the first drawer, the component receiving space extending a length L from the drawer front end toward the chassis rear side;
wherein the second drawer remains within the chassis when the first drawer is at the first open position or the second open position;
wherein the second drawer remains stationary within the chassis when the first drawer is sliding in the outward direction to the first open position; and
wherein the space between the first drawer at the second open position and the second drawer is at least equal to the length L.

2. The apparatus of claim 1, wherein the second drawer remains stationary within the chassis when the first drawer is sliding in the outward direction and the space is less than L.

3. The apparatus of claim 1 wherein the second drawer slides in the outward direction together with the first drawer during a transition from the first open position to the second open position.

4. The apparatus of claim 3, wherein the space between the first drawer and the second drawer is at least equal to the length L during the transition from the first open position to the second open position.

5. The apparatus of claim 1 wherein the second drawer slides in the outward direction together with the first drawer after the space is at least equal to L.

6. The apparatus of claim 1, wherein the second drawer remains stationary within the chassis when the first drawer is sliding in an inward direction with respect to the chassis front side during a transition from the second open position to the first open position.

7. The apparatus of claim 6, wherein the second drawer slides in the inward direction together with the first drawer after the transition from the second open position to the first open position.

8. The apparatus of claim 1, wherein the space between the first drawer and the second drawer is less than the length L when the first drawer is sliding in an inward direction with respect to the chassis front side during a transition from the second open position to the first open position.

9. A storage server, comprising:
a chassis comprising a chassis front side opposite a chassis rear side;
a first hard drive drawer positioned in the chassis and configured for housing a first group of hard drives, the first hard drive drawer configured to slide in an outward direction with respect to the chassis front side to a first open position partly beyond the chassis front side and to a second open position beyond the chassis front side;
a second hard drive drawer positioned in the chassis between the first hard drive drawer and the chassis rear side and configured to slide in the outward direction, the second hard drive drawer configured for housing a second group of hard drives in a plurality of hard drive receiving spaces facing the first hard drive drawer, each of the plurality of hard drive receiving spaces extending a length L toward the chassis rear side;
wherein the second hard drive drawer remains within the chassis when the first hard drive drawer is at the first open position or the second open position;
wherein the second hard drive drawer remains stationary within the chassis when the first hard drive drawer is sliding in the outward direction to the first open position; and
wherein the space between the first hard drive drawer at the second open position and the second hard drive drawer is at least equal to the length L.

10. The storage server of claim 9, wherein the second hard drive drawer remains stationary within the chassis when the first hard drive drawer is sliding in the outward direction and the space is less than L.

11. The storage server of claim 9 wherein the second hard drive drawer slides in the outward direction together with the first hard drive drawer during a transition from the first open position to the second open position.

12. The storage server of claim 11, wherein the space between the first hard drive drawer and the second hard drive drawer is at least equal to the length L during the transition from the first open position to the second open position.

13. The storage server of claim 9 wherein the second hard drive drawer slides in the outward direction together with the first hard drive drawer after the space is at least equal to L.

14. The storage server of claim 9, wherein the second hard drive drawer remains stationary within the chassis when the first hard drive drawer is sliding in an inward direction with respect to the chassis front side during a transition from the second open position to the first open position.

15. The storage server of claim 14, wherein the second hard drive drawer slides in the inward direction together with the first hard drive drawer after the transition from the second open position to the first open position.

16. The storage server of claim 9, wherein the space between the first hard drive drawer and the second hard drive drawer is less than the length L when the first hard drive drawer is sliding in an inward direction with respect to the chassis front side during a transition from the second open position to the first open position.

* * * * *